US007113205B2

(12) United States Patent
Cappellaro

(10) Patent No.: US 7,113,205 B2
(45) Date of Patent: Sep. 26, 2006

(54) METHOD FOR RECORDING AND DISPLAYING FLUORESCENCE IMAGES WITH A HIGH SPATIAL RESOLUTION

(75) Inventor: Markus Cappellaro, München (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 757 days.

(21) Appl. No.: 10/078,688

(22) Filed: Feb. 21, 2002

(65) Prior Publication Data

US 2002/0176007 A1    Nov. 28, 2002

(30) Foreign Application Priority Data

Feb. 24, 2001    (DE)    ................................ 101 09 130

(51) Int. Cl.
*H04N 5/225*    (2006.01)
*H04N 5/235*    (2006.01)
*G06K 9/62*    (2006.01)

(52) U.S. Cl. ................ 348/218.1; 348/219.1; 348/229.1; 382/228

(58) Field of Classification Search ............ 348/226.1, 348/229.1, 218.1, 219.1, 36; 382/228
See application file for complete search history.

(56) References Cited

U.S. PATENT DOCUMENTS 5,299,048 A  *  3/1994  Suyama ...................... 398/181

| | | | |
|---|---|---|---|
| 5,682,567 A | | 10/1997 | Spruck |
| 5,798,801 A | * | 8/1998 | Skinner ...................... 348/645 |
| 6,225,636 B1 | * | 5/2001 | Ginestet .................. 250/458.1 |
| 6,573,933 B1 | * | 6/2003 | Takayama ................ 348/226.1 |
| 6,630,953 B1 | * | 10/2003 | Toyoda et al. ........... 348/226.1 |
| 6,650,779 B1 | * | 11/2003 | Vachtesvanos et al. ..... 382/228 |
| 6,882,363 B1 | * | 4/2005 | Oda et al. ................ 348/226.1 |
| 6,885,772 B1 | | 4/2005 | DeLong |
| 2004/0056966 A1 | * | 3/2004 | Schechner et al. ........ 348/229.1 |

FOREIGN PATENT DOCUMENTS

DE    38 37 063    3/1990

* cited by examiner

*Primary Examiner*—Lin Ye
(74) *Attorney, Agent, or Firm*—Walter Ottesen

(57) ABSTRACT

The invention relates to a method for recording and displaying fluorescence images with high spatial resolution. Several recordations of an image of an object are made sequentially with an electronic camera and, between recordations, the image of the object and the electronic camera are shifted relative to each other. The recordations are subsequently unified to a compiled image of higher spatial resolution. Before or after the partial images are brought together, the signals, which belong to image points of the images and which are obtained at different times, are amplified with amplification factors which are dependent upon the time intervals between the image recordations and are essentially reciprocal to the time dependency of the fluorescence. Artefacts caused by decreasing fluorescence intensities (fading, bleaching) are thereby avoided. These fluorescence intensities decrease as a function of time.

22 Claims, 6 Drawing Sheets

METHOD FOR RECORDING AND DISPLAYING FLUORESCENCE IMAGES WITH A HIGH SPATIAL RESOLUTION

BACKGROUND OF THE INVENTION

The recordation of images, especially fluorescence images, in microscopy takes place today often with digital cameras such as CCD cameras. For this purpose, cameras today are used in different configurations and with different recording quality. In the selection of a camera, the parameters of recording time and resolution are, as a rule, mutually opposed. For a high image rate, only a limited recording quality can be achieved. High resolution digital cameras with correspondingly higher spatial resolution require an adequate exposure time for the reduction of the image noise per image spot. Further differences lie in the type of the color recording with or without color dividers and color filters in the light path and therefore sequential or parallel recording of the color channels.

In the parallel recording of color images with three color channels of a one-chip sensor, the basic problem is present that the actually available resolution of the sensor is at least halved by the color mask which is introduced. Here, for example, a green mask is disposed on the one half of the light-sensitive elements (pixels) and the other half is subdivided between red and blue with equal parts. Correspondingly, the available spatial resolution becomes less in the respective spectral channels. In cameras of this kind, as a rule, a mathematical interpolation between the measured image points is used in order to generate a color image having the basic resolution of the CCD sensor.

German patent 3,837,063 discloses a method known as the so-called "color-co-site-sampling method". With this method, the resolution loss caused by the color mask is completely compensated. For this purpose, the CCD sensor is displaced by a highly precise piezo-mechanical device relative to the image to be recorded in such a manner that complete partial images are recorded with the three color channels (R-G-B) sequentially at respectively different positions. Thereafter, and without interpolation, a complete image is developed by subsequent interlacing of the sequentially recorded partial images. The displacement takes place in dependence upon the color mask so that one and the same point in the object is detected sequentially by the three color channels (for example, 2x green, 1x red and 1x blue).

The scanning of an image in both directions can be increased up to a factor of three via an additional microscanning. Correspondingly, the number of recorded image points can be increased up to a further factor of nine; a further increase of the scanning is not purposeful because of the finite aperture.

The microscanning technique for increasing the resolution, however, causes that an image P is compiled from several sequentially recorded partial images $P_n$. For this reason, the method is sensitive to movements of the object or changes in luminosity. During recording of fluorescent images, the stability and brightness of the object is a problem. Because of the illumination exciting the fluorescence, the specimen undergoes a bleaching, a so-called photobleaching, and thereby a reduction of the intensity of the fluorescence, a so-called fading. With the compilation of the sequentially recorded partial images, artefacts then occur in the complete image, which are caused by the different fluorescence intensities of the sequentially recorded partial images.

To eliminate fading artefacts in the compilation of sequentially recorded partial images, U.S. Pat. No. 5,682,567 discloses compensating the intensity of the fluorescence, which becomes less from one image to the next, by a corresponding lengthening of the recording time. The correction of the exposure time required for this is determined in each case in advance of the data acquisition. The artefacts in the compiled image are, however, only avoided if the fluorescence intensities actually follow the law which forms the basis of the computation of the corrected exposure times.

SUMMARY OF THE INVENTION

It is an object of the invention to provide a method for recording and displaying fluorescence images having high spatial resolution wherein the occurrence of fading artefacts is avoided.

The method of the invention is for recording and displaying fluorescence images with high spatial resolution. The method includes the steps of: making several recordings of an image of an object sequentially at time intervals with an electronic camera to obtain partial images; introducing lateral displacements between the electronic camera and the object between the recordings; joining the partial images to form a compiled image of higher spatial resolution; obtaining signals of image points of the partial images at different time points; and, amplifying the signals with amplification factors which are dependent upon the time intervals between the recordings.

To increase spatial resolution, digital cameras are utilized as described above, with which a multiple scanning is carried out in the so-called microscanning method. A displacement of the scanned image is achieved either by deflecting the camera sensor relative to the image or by deflecting the beam path relative to the camera sensor. The sequentially recorded partial images are intermediately stored in the camera or in the connected image computer and thereafter computed to an image of increased resolution.

According to the invention, the execution of the intensity compensation is carried out before or after the interlacing of the measurement data with the objective to so compensate the brightness and color differences of the individual partial images and their color channels that an optimal compensation for the fluorescence recordation is provided. For this purpose, the intensity signals, which belong to the individual image points, are amplified by amplification factors which are dependent upon the time intervals between the image recordings.

The time dependency of the amplification factors is essentially reciprocal to the time dependency of the intensity of the fluorescence.

The amplification of the intensity signals, which belong to the individual image points, can take place in time ahead of joining the sequentially recorded recordations. Alternatively, it is possible that the sequentially recorded recordations are first compiled to a complete image of higher resolution and thereafter the signals, which belong to the image points of the compiled image, are amplified.

The amplification factors can be determined by averaging the signals in the individually sequentially recorded recordations. However, it is advantageous when the amplification factors are provided by averaging the signals in component regions of the individually sequentially recorded recordations. A further improvement is provided by the segmentation of the partial images in accordance with the fluorescing objects and the control of the amplification factors in dependence upon the fluorescing objects and background. The segmentation can be performed by the simple means of a threshold interrogation for distinguishing background luminescence and fluorescing objects but also with more complex methods as described, for example, in U.S. Pat. No. 6,885,772, and incorporated herein by reference. A further improvement is obtained especially for a low noise level.

Furthermore, it is possible to determine the amplification factors for the individual sequentially recorded recordations by approximation of a trace or course of the intensity of the substances excited for fluorescence with this trace approximating the natural decay characteristics over time. If the decay characteristic of the fluorescence of the used substance is known, and if the recording of the shifted partial images takes place at a fixed time raster $\Delta t$, then, in the ideal case, this rule can be used directly for the compensation of the fading effect and for the determination of the amplification factors. As a rule, however, the parameters of the decay curve are subjected to fluctuations from specimen to specimen. A further improvement is, however, obtained when the knowledge of the basic decay characteristic of a substance (for example, corresponding to the exponential function) is used to determine the real decay curve and so reduces the influence of the statistical fluctuations of the measurement results. The parameters of the ideal decay curve are obtained by approximation from the mean attenuation values of the individual component measurements.

In an advantageous embodiment, the individual sequentially recorded recordations are segmented into image regions and the signals, which belong to the image points of different image regions, are amplified by different amplification factors and the signals, which belong to the image points of the same image region, are amplified by identical amplification factors.

The use of the invention is especially advantageous when a color CCD camera is utilized as a digital camera for the image recordation because then, the bleaching effects are especially strong because of the relatively long exposure times. When using a color camera, the displacement between the image and the camera takes place in such a manner that one and the same point of the object is imaged sequentially on different color channels of the same CCD pixel of the camera.

It can be practical to use different amplification factors for the various color channels.

The method of the invention is especially advantageous also when applied to multiple fluorescences, that is, when several substances, which fluoresce at different wavelengths, are contained in the imaged specimen, with these substances being excited simultaneously to fluoresce by the utilized excitation light. Different amplification factors can be determined for the individual emissions while considering the spectral sensitivity curves of the color channels of the camera.

The determination of the amplification factors for the individual emissions can take place by solving a linear equation system. Alternatively, it is possible to use methods of fuzzy logic for the determination of the amplification factors for the individual emissions or to apply methods of neural fuzzy logic, that is, methods which are based on unsharp relationships in the form of relations as determination criteria in lieu of fixed relationships in the form of equations.

The individual emissions can subsequently be displayed as false colors.

The invention is advantageously used in combination with a fluorescence microscope having an optical illuminating system, an optical imaging system, an image recording system and a computer system. The computer system is configured to execute the particular correction and superposition of the partial images.

The invention can be implemented with hardware or with software in a computer.

The object of the invention is to so determine the amplification factors for the color channels of the individual partial images that the intensity of the color channels is the same over all partial images after compensation and so that no disturbing artefacts occur when interlacing. The nature of the interlacing of the R-G-B sensors and the sequence with which the individual partial images are obtained is of subordinate significance. The invention is, however, applicable also for gray value images in that only one channel per partial image is processed.

If the method is applied to already interlaced R-G-B images, it is to be accepted that in given CCD arrays often two image points each in the green channel are superposed on each other with the interlacing and can no longer be individually separated and corrected.

The compensation of the intensity drop by simple amplification leads, as a rule, to a raising of the image noise. It can therefore be practical to carry out optimization of the image noise in addition to the compensation of the brightness of the individual partial images. Corresponding methods for adaptive, noise-optimized filtering are known, for example, from the text of William A. Pratt entitled "Digital Imaging Processing", 1978, John Wiley & Sons, Inc., New York.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
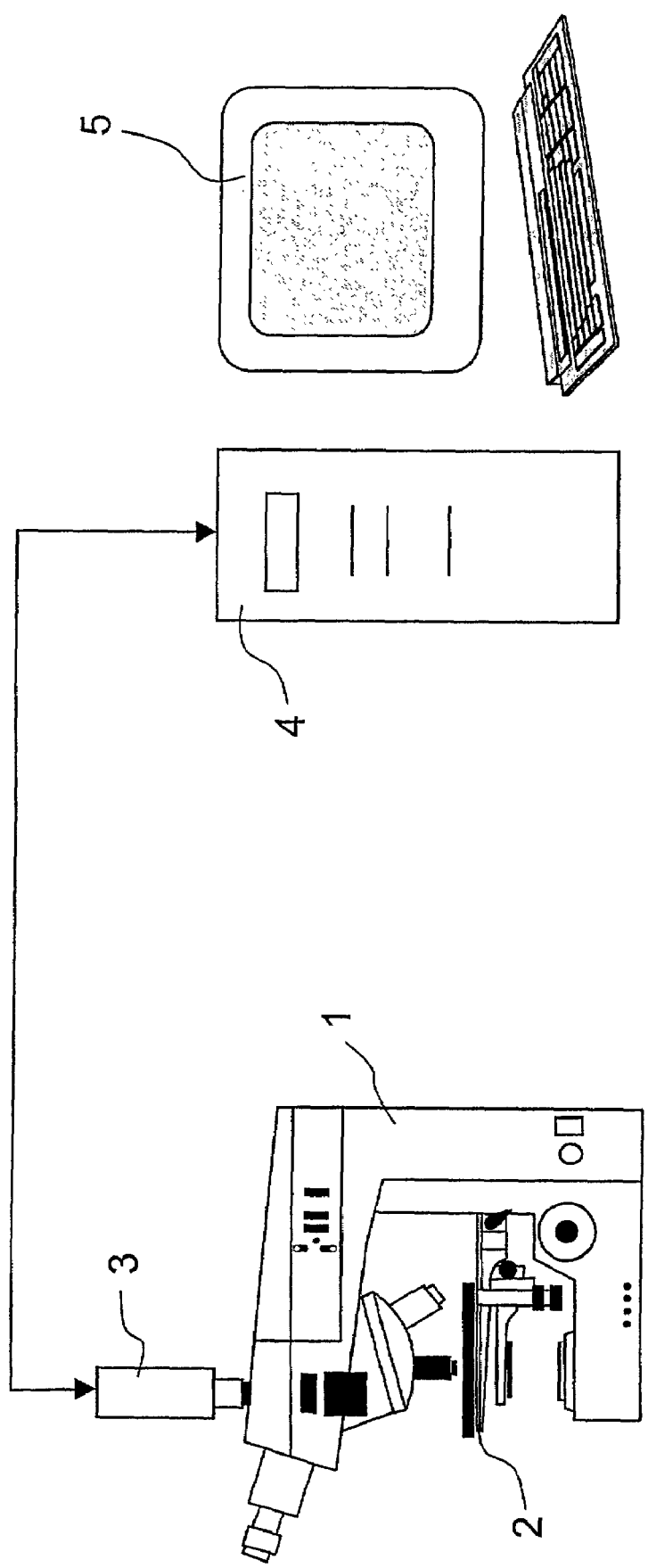
FIG. 1 is a schematic showing a microscope with a camera and computing system for carrying out the invention in fluorescence microscopy.

The system shown in FIG. 1 comprises a microscope 1 having a motor-driven specimen table 2, a video camera 3 and an image processing computer 4 and a monitor 5 connected to the latter. The monitor functions for image display.

Figure 2A:
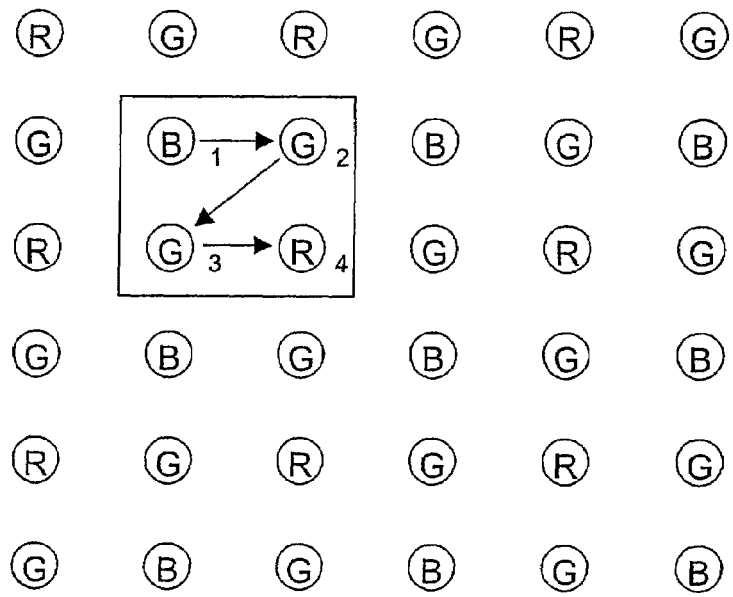
FIG. 2a is a schematic representation of CCD arrays having an arrangement of a color mask and the path for recording partial images.

The generation of color images without additional interpolation takes place in accordance with the color-co-site method with a color mask corresponding to FIG. 2a. There, the red, green and blue sensitive color pixels are indicated by reference characters R, G and B, respectively. Four individual images are needed for the color-co-site method. These individual images are recorded by a shift of the recording system relative to the image to be recorded (or with a displacement of the image relative to the recording system) in four sequential steps by one raster point in the x and y directions in each case corresponding to the running path of 1-2-3-4. From this, a multiplication results by $m_c \times n_c = 2 \times 2 = 4$ partial images.

For recording microscopic images with high resolution, the so-called microscanning method is utilized in addition for increasing the density of the image scanning and therefore the resolution of the image system. A multiple scanning of the object is achieved via the relative displacement of the CCD sensor and the beam path of the microscopic imaging, that is, a displacement of the imaged object detail relative to the sensor surface of the CCD sensor between the partial images. Generally, one obtains the highly resolved superposition image P(x,y) from $m_r \times n_r$ individual images $P_t(x,y)$. The lateral resolution in the compiled image corresponds to the $m_r$ or $n_r$ multiple of the lateral resolution of the individual images.

Figure 2B:
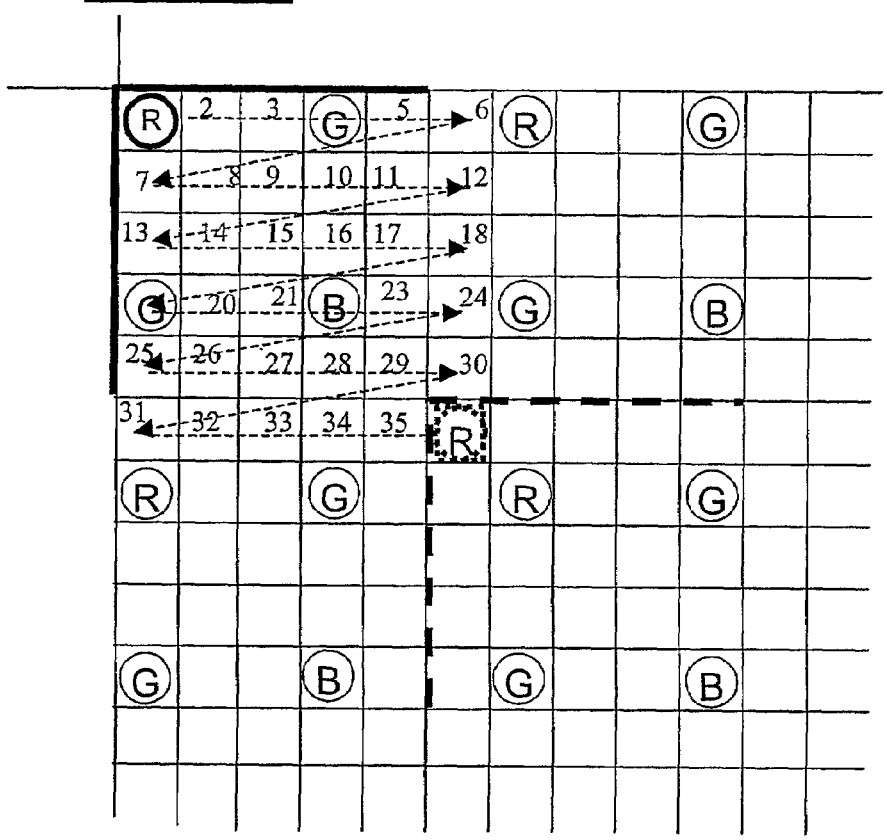
FIG. 2b is a schematic showing the scanning in the co-site-sampling method with an additional three-time resolution.

FIG. 2b shows a possible sequence of the displacements with a three-time resolution and simultaneous application of the color-co-site method. The lattice defines the scanning raster placed over the image. The portion identified by the solid line shows a corner of the CCD array with the red sensitive CCD cell arranged there. The array is shifted in 6×6 steps by one raster field of the scanning raster in each case relative to the image and is read out in 36 individual data sets which each define a partial image. To obtain an error-free superposition of the sequentially obtained partial images, the object details should not move relative to each other during the entire recording time of the series of the partial images.

A change of the intensity, however, takes place perforce with the recordation of fluorescence images. The intensity of fluorescence of the emitting regions decays (bleaches out) with time. Accordingly, with the recordation of cells excited with the marker "Oregon Green 488", the intensity of the fluorescence is attenuated by 50% in the recording time of 20 seconds. The attenuation is dependent upon the particular peripheral conditions (light intensity, free radicals, et cetera). If one joins the individual partial images to a total image in correspondence to the displaced scanning, then one obtains artefacts in the image because of the different intensities. In a read-out sequence according to neighboring elements in the line and subsequently to neighboring lines, artefacts preferably occur in the line direction, as a rule, bright and dark image strips following sequentially in the line direction.

Figure 3:
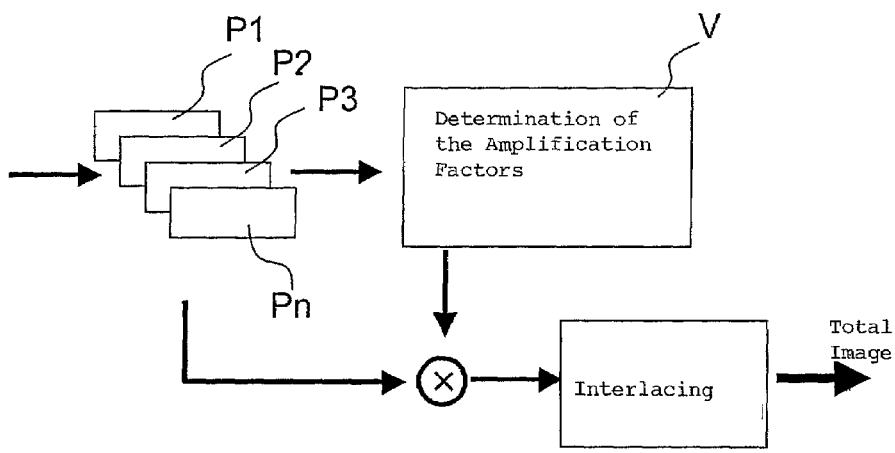
FIG. 3 is a block circuit diagram for the interlacing of partial images.

With the method of the invention for compensating the intensity differences in decaying fluorescence, the display of an artefact-free fluorescence image of high image quality is possible. As shown in FIG. 3, the intensity values of the individual partial images (P1, P2, . . . Pn) are multiplied by the amplification factors V before or after interlacing.

Figure 4:
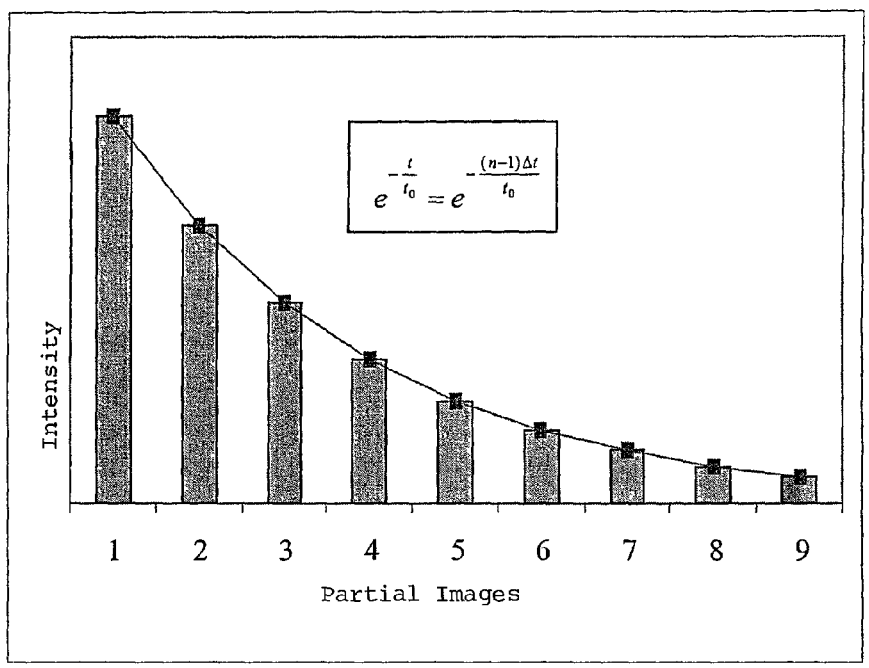
FIG. 4 is a diagram showing the drop of the intensity during a microscan.

With a fluorescence recordation, the intensity of the emitted light is proportional to the quantity of the fluorophor concentration. The number of the luminescent bodies as a rule drops off in correspondence to an exponential function. For this reason, the intensity of the image also reduces in correspondence to an exponential function. This is shown, for example, for nine partial images in FIG. 4. The half value times or the attenuation constant $1/t_0$ for different substances (also called markers) are, as a rule, known or can be determined by measurement.

For the intensity $I_t$ of an object at the time point t, the following applies with an initial intensity $I_0$:

$$I_t = I_o e^{-\frac{t}{t_0}} \quad \text{Equation (1)}$$

and for the image points of the partial image measured at time t, the result is:

$$P_t(x, y) = P_0(x, y) e^{-\frac{t}{t_0}} \quad \text{Equation (2)}$$

If the attenuation constant is known, then the attenuation of the individual partial images can be compensated by the amplification $V_t$ $$V_t = e^{t/t_0} \quad \text{Equation (3)}$$

For the individual compensated partial image, one therefore obtains $$\tilde{P}_t(x,y) = V_t P_t(x,y) \quad \text{Equation (4)}$$

or for discrete image points (k,l):

$$\tilde{P}_t(k,l) = V_t P_t(k,l) \quad \text{Equation (4a)}$$

For an increase in the resolution by the factor $m_r$ in the x direction and $n_r$ in the y direction, one obtains, for an interlacing of a total of m*n partial images of the magnitude K*L, a total image of the size M*N:

$$M = mK = m_c m_r K \text{ and } N = nK = n_c n_r L$$

and, for the discrete image points i, j, one obtains:

$$P(i, j) = \sum_{m\,n} \tilde{P}_{t\nu\mu}(k, l)$$

with $$i = m(k-1) + \mu,$$

$$j = n(l-1) + \nu;$$

or $$k = \left[\frac{i-1}{m}\right]_{floor} + 1, \quad \mu = i - m(k-1), \quad \text{Equation (5)}$$

$$l = \left[\frac{j-1}{n}\right]_{floor} + 1, \quad \nu = j - n(l-1),$$

If the attenuation constant is not explicitly present, then it can be approximately determined from the measured data of the partial images in accordance with various methods. Examples of these methods are presented below:

Mean Value of the Partial Images

Assuming that the intensities of the three-color channels (R, G, B) drop off in accordance with the same attenuation law and with the same attenuation constant $1/t_0$, one can determine the intensity of an image as the mean value over all n image points:

$$I_t = \overline{P}_t = \frac{1}{n} \sum_n P_t(k, l) \qquad \text{Equation (6)}$$

Correspondingly, the intensity for the individual color channels R(k,l), G(k,l) and B(k,l) and pixels (k,l) can be determined $$I_{Rt} = \overline{R}_t = \frac{1}{n} \sum_n R_t(k, l) \qquad \text{Equation (6a)}$$

$$I_{Gt} = \overline{G}_t = \frac{1}{n} \sum_n G_t(k, l)$$

$$I_{Bt} = \overline{B}_t = \frac{1}{n} \sum_n B_t(k, l)$$

With the same decay characteristic for all color channels, the quotients of the intensity of a color channel at time t and of the initial intensity of the color channel at time $t_0$ can be summed and the amplification factor can be formed from the sum:

$$V_t = 3\left(\frac{\overline{R}_t}{\overline{R}_0} + \frac{\overline{G}_t}{\overline{G}_0} + \frac{\overline{B}_t}{\overline{B}_0}\right)^{-1} \qquad \text{Equation (7)}$$

The amplification factor is determined with a higher statistical reliability from the summation of the attenuations of the individual color channels.

Determination of the Mean Attenuation Coefficient

Figure 5:
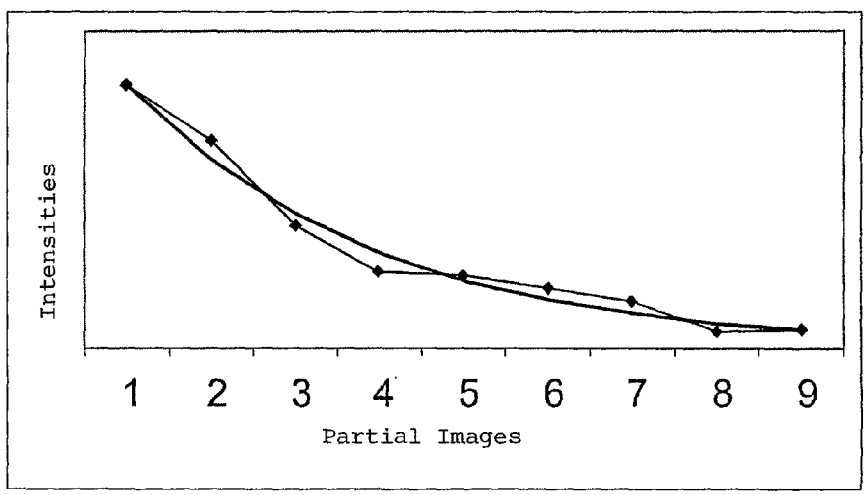
FIG. 5 is a diagram for the approximation of the measured intensities utilizing an exponential function.

Corresponding to the formula of equation (6), the intensities of the individual partial images are computed and, from this, the attenuation values $I_t/I_0$ are computed as the quotient from the intensity at time t and the intensity at time $t_0$. If one proceeds from an attenuation according to the exponential function, then one can approximate the series of attenuation functions of the individual partial images via the e-function corresponding to equation (1) and the constant $t_0$ can be so determined ("fitted") that the measured attenuation values are approached as good as possible (FIG. 5). Corresponding methods for approximation are known from the literature. The compensation of the attenuations takes place in accordance with the above-described method in correspondence with equation (4).

Determination of the Attenuation Coefficients by Segmentation of the Fluorescing Objects With fluorescing objects, the intensity attenuates essentially within the object itself over time. In contrast, the intensity of the background remains relatively constant. New artefacts can be generated in the image background via a global compensation with a unitary amplification factor for the total image. This is so because the intensity of the image background also forms the basis in the determination of the attenuation and of the amplification factor. A further improvement of the compensation can be achieved when the fluorescing objects are segmented in a partial image in a preceding segmenting step 6 (see FIG. 7) and a mask of the segmented image regions is formed in a subsequent masking step 7. With the aid of the formed mask, only those image regions are applied from the subsequent partial images for the determination of the amplification factors $V_t$ for compensating the attenuation which correspond to the segmented regions of the first partial image. Correspondingly, only the intensities in the masked image regions are correspondingly amplified for the subsequent interlacing of the partial images; whereas, for the image background, an amplification factor V=1.0 is used. A determination of locally dependent amplification factors for the background is, of course, also possible.

The segmentation can, for example, take place via a simple threshold value inquiry. As a rule, however, one would use methods with the application of local mean values and local variants. Such methods are, for example, described in the publication of Bernd Jähne et al entitled "Handbook of Computer Vision and Applications" (1999), Academic Press, London. An especially high reliability in the determination of the object limits can be achieved with the methods suggested in U.S. Pat. No. 6,885,772, and incorporated herein by reference.

Figure 7:
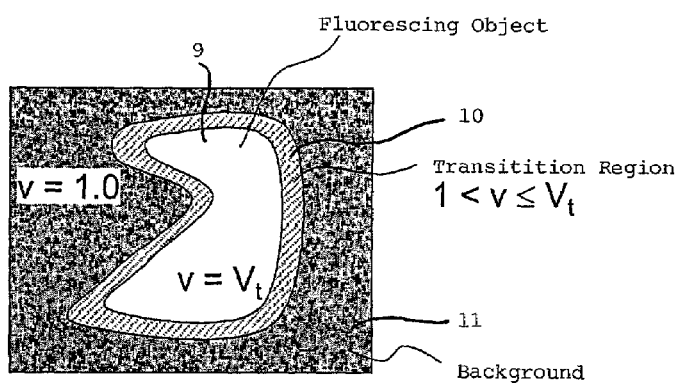
FIG. 7 shows segmented image regions.

Basically, the segmentation can be carried out for each measured partial image. It is, however, adequate to carry out a segmentation only based on the first partial image and to generate an object mask M(k,l) for characterizing the objects and to use this mask for all further evaluations and computations of the amplification factors. The compensation can likewise remain limited to the segmented objects. However, to avoid additional artefacts at the object boundaries, it is advantageous to include a transition region along the object edges wherein the amplification increases from 1 to $V_1$ as shown in FIG. 7. The object mask M(k,l) is transferred into the amplification matrix $M_t(k,l)$. For the compensated partial image, one obtains:

$$\tilde{P}_t(k,l) = M_t(k,l) \circ P_t(k,l) \qquad \text{Equation (8)}$$

wherein the symbol 602 is here used for a multiplication of the individual elements of the matrix or of the image.

Figure 6:
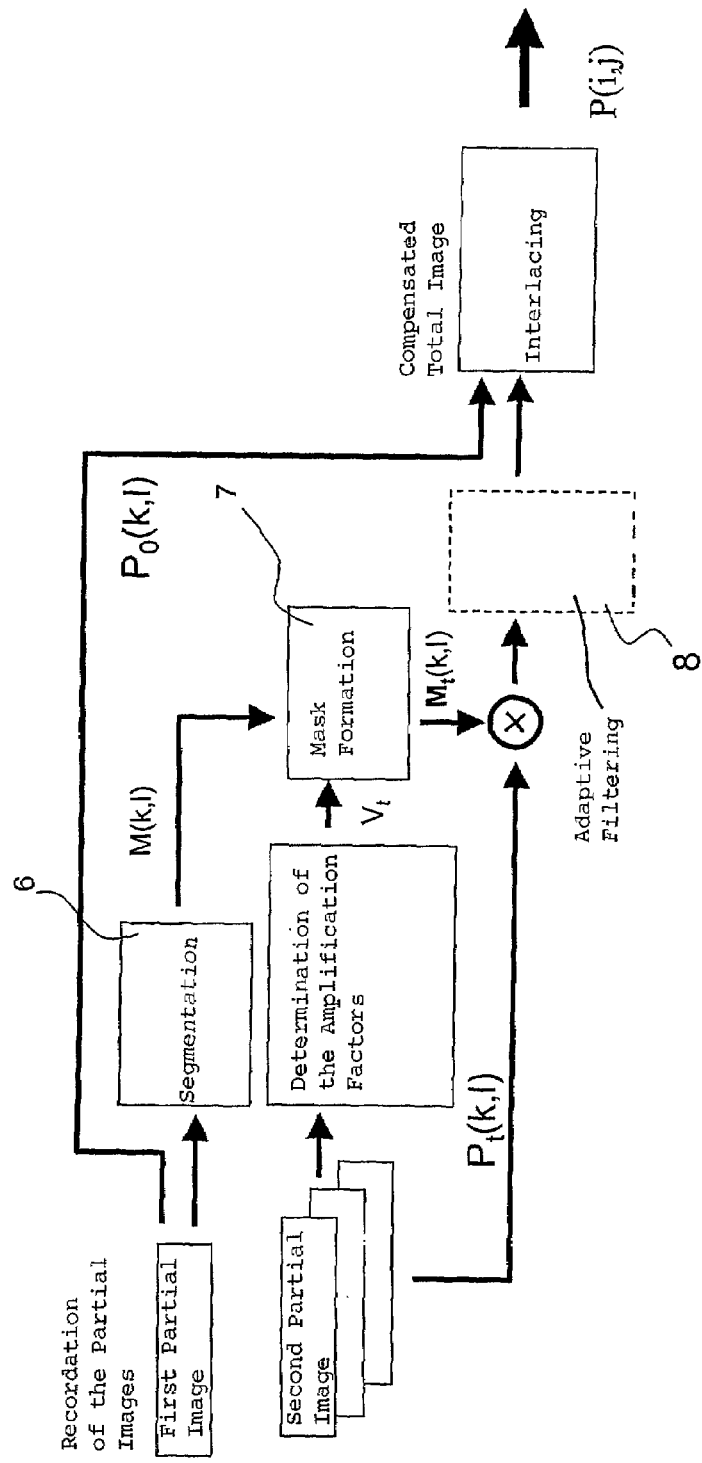
FIG. 6 is a block circuit diagram of an expanded fading compensation.

The total partial image or a partial region of the image is amplified in the compensation of the attenuated emission in the individual partial images. Simultaneously, the image noise of the compensated partial images is increased with the amplification of the object. This leads to an amplified noise in the interlaced total image. By introducing an additional processing step having adaptive image filtering (block 8 of FIG. 6), for example, in accordance with the optimal filter method and an additional control of the adaptive filter via the amplification factor $V_t$, the image noise, which is increased by the previous method steps, is again compensated. The methods for adaptive filtering, which are here applied, are known from the literature and are described, for example, in the text of William A. Pratt entitled "Digital Image Processing" (1978), John Wiley & Sons Inc., New York.

Multichannel Fluorescence

The method can be expanded also to a simultaneous multichannel fluorescence. If one excites the object with up to three markers, which emit light at different wavelengths, then it is possible to distinguish maximally three fluorescence channels and to automatically separate the same. A condition precedent for this is, however, that several emission signals do not fall exclusively or for the most part into one color channel. Stated otherwise, with three separate markers, the emission centers should be distributed over all three color channels.

Figure 8:
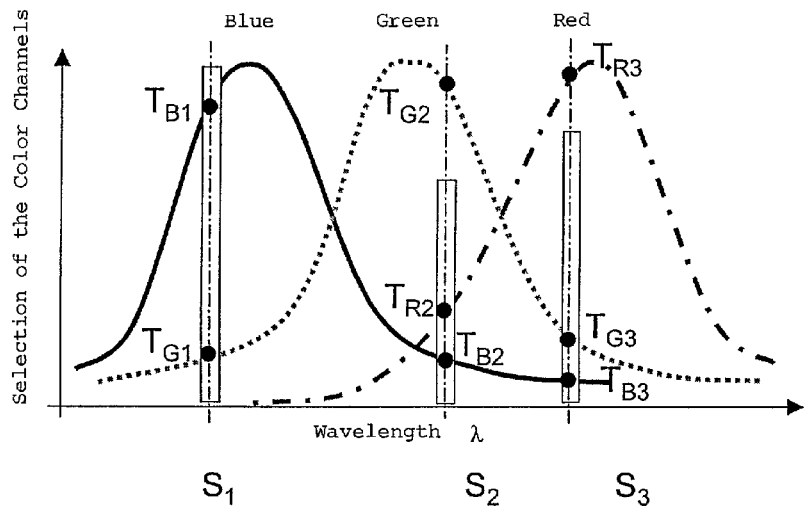
FIG. 8 shows selection curves of the color channels.

Furthermore, it is assumed that the spectral sensitivity curves of the individual color channels in dependence upon the wavelength are known. In FIG. 8, the spectral sensitivity curves of the individual color channels (blue, green, red) of a recording system are shown schematically. The signals $S_1$ to $S_3$, which are shown in the diagram (for example, the fluorescence lines of three markers (1, 2, 3)), contribute with the transmission coefficients $T_{xn}$ to the color channel. Here, x identifies the color channels (R, G, B) and n identifies the number of the signal or marker. In this way, one obtains, for example, for the intensity of the red channel R (k,l):

$$R(k,l) = T_{R1}S_1(k,l) + T_{R2}S_2(k,l) + T_{R3}S_3(k,l) \quad \text{Equation (9)}$$

A corresponding sum of the components results for the intensity of the green channel G (k,l) and the intensity of the blue channel B (k,l). The equations can be simplified with the transmission matrix T as a matrix equation:

$$T = \begin{pmatrix} T_{R1} & T_{R2} & T_{R3} \\ T_{G1} & T_{G2} & T_{G3} \\ T_{B1} & T_{B2} & T_{B3} \end{pmatrix} \quad \text{Equation (10)}$$

From the above, the following results:

$$\begin{pmatrix} R(k,l) \\ G(k,l) \\ B(k,l) \end{pmatrix} = \begin{pmatrix} T_{R1} & T_{R2} & T_{R3} \\ T_{G1} & T_{G2} & T_{G3} \\ T_{B1} & T_{B2} & T_{B3} \end{pmatrix} \begin{pmatrix} S_1(k,l) \\ S_2(k,l) \\ S_3(k,l) \end{pmatrix} \quad \text{Equation (10a)}$$

By solving the equation system, the intensities $S_1(k,l)$, $S_2(k,l)$ and $S_3(k,l)$ of the individual signals are obtained for each image point (k,l)

$$S_n = \frac{|T_n|}{|T|} \quad \text{Equation (11)}$$

wherein |T| is the determinant of the matrix T and $|T_n|$ is the determinant which arises from replacing the n-th column in the matrix T with the vector {R G B}

$$S_1 = \frac{\begin{vmatrix} R & T_{R2} & T_{R3} \\ G & T_{G2} & T_{G3} \\ B & T_{B2} & T_{B3} \end{vmatrix}}{\begin{vmatrix} T_{R1} & T_{R2} & T_{R3} \\ T_{G1} & T_{G2} & T_{G3} \\ T_{B1} & T_{B2} & T_{B3} \end{vmatrix}} \quad \text{Equation (12)}$$

$$S_2 = \frac{\begin{vmatrix} T_{R1} & R & T_{R3} \\ T_{G1} & G & T_{G3} \\ T_{B1} & B & T_{B3} \end{vmatrix}}{\begin{vmatrix} T_{R1} & T_{R2} & T_{R3} \\ T_{G1} & T_{G2} & T_{G3} \\ T_{B1} & T_{B2} & T_{B3} \end{vmatrix}}$$

$$S_3 = \frac{\begin{vmatrix} T_{R1} & T_{R2} & R \\ T_{G1} & T_{G2} & G \\ T_{B1} & T_{B2} & B \end{vmatrix}}{\begin{vmatrix} T_{R1} & T_{R2} & T_{R3} \\ T_{G1} & T_{G2} & T_{G3} \\ T_{B1} & T_{B2} & T_{B3} \end{vmatrix}}$$

wherein $S_1$, $S_2$, $S_3$ and R, G, B are functions of (k,l).

The results of equation 12 can be summarized as follows:

$$S_1(k,l) = A_{R1}R(k,l) + A_{G1}G(k,l) + A_{B1}(k,l), \quad \text{Equation (13)}$$
$$S_2(k,l) = A_{R2}R(k,l) + A_{G2}G(k,l) + A_{B2}B(k,l),$$
$$S_3(k,l) = A_{R3}R(k,l) + A_{G3}G(k,l) + A_{B3}B(k,l).$$

The color image can be separated into the imaging of the three emitting signals. Gray values or false colors can be assigned to the individual signals. It is noted again that, for a good separation of the signals, the individual signals should not lie too close to each other with respect to frequency and individual transmission coefficients should not become too small. The equations can be correspondingly simplified for two different markers.

To compensate fading effects, the partial images, which are measured at different times, each have to be split up into the signals $S_{1t}$, $S_{2t}$, $S_{3t}$. The computation of the compensation of the individual signals then takes place corresponding to the above-mentioned methods for each fluorescing signal. Correspondingly, the methods for determining the amplification factors are applied to the individual signals or their images.

Figure 9:
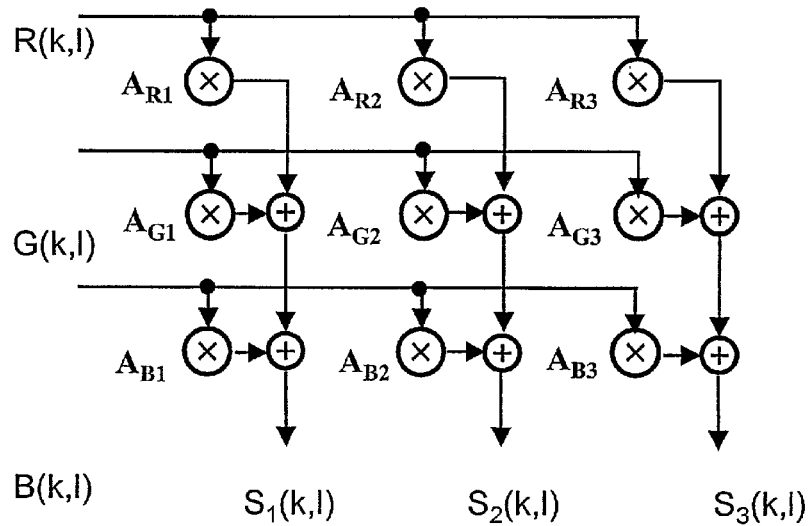
FIG. 9 is a block circuit diagram of a section of a computing device for channel separation.

The realization of the above-mentioned relationships is possible with special computing apparatus for signal processing. A simple computing device can be used for the separation of the individual emission signals as shown in FIG. 9 wherein all computing operations can run in parallel in a pipeline method. Such a pipeline computer contains nine multiplication stages and six summation stages. Appropriate circuits can be provided for the remaining computing steps. The realization of all functions is, however, likewise possible with commercially available signal processors or on a work computer (PC) via a corresponding software.

In addition to the solution of the given linear equation system, the separation of the individual fluorescence channels can also take place for signals having a high noise level in accordance with the principle of a fuzzy method or neurofuzzy method. In this case, it is not linear equations that form the basis for the separation of the contributions of the individual markers to the total intensities of the individual color channels but inequalities or relationships with which approximation values for the intensities of the individual markers are estimated.

It is understood that the foregoing description is that of the preferred embodiments of the invention and that various changes and modifications may be made thereto without departing from the spirit and scope of the invention as defined in the appended claims.

What is claimed is:

1. A method for recording and displaying fluorescence images with high spatial resolution, the method comprising the steps of:
    making several recordings of an image of an object sequentially at time intervals with an electronic camera to obtain partial images;
    introducing lateral displacements between said electronic camera and said image between said recordings;
    joining said partial images to form a compiled image of higher spatial resolution;
    obtaining signals of image points of said partial images at different time points; and,
    amplifying said signals with amplification factors which are dependent upon said time intervals between said recordings.

2. The method of claim 1, wherein the dependency on time of said amplification factors is essentially a reciprocal of the time dependency of the intensity of the fluorescence.

3. The method of claim 1, wherein said signals are amplified in advance of the compilation of the sequentially made recordings.

4. The method of claim 1, wherein the sequentially made recordings are first compiled to a total image of higher resolution and then the signals belonging to the image points of said compiled image are amplified.

5. The method of claim 1, wherein said amplification factors are determined by averaging the signals in the individual sequentially made recordings.

6. The method of claim 1, wherein said amplification factors are determined by averaging the signals in the component regions of the individual sequentially made recordings.

7. The method of claim 1, wherein the amplification factors for the individual sequentially made recordings are determined by approximation of a trace of the intensity of substances excited to fluoresce; and, said trace approximates the natural attenuation characteristic as a function of time.

8. The method of claim 1, wherein an adaptive image filtering of said compiled image is made to suppress noise.

9. The method of claim 6, comprising the further steps of:
    segmenting the sequentially made recordings into image regions;
    amplifying the signals corresponding to the image points of different ones of said image regions with different amplification factors; and,
    amplifying the signals, which belong to the same image region, with identical amplification factors.

10. The method of claim 1, wherein said electronic camera is a color CCD camera used for the image recordings.

11. The method of claim 10, wherein the lateral displacement between the image of the object and said electronic camera takes place so as to cause the same point of said object to be imaged sequentially onto different color channels of the same CCD pixel of said electronic camera.

12. The method of claim 11, wherein different amplification factors are used for the different color channels.

13. The method of claim 11, comprising the further steps of:
    simultaneously exciting several fluorescence emissions; and,
    determining different amplification factors for the individual emissions while considering spectral sensitivity curves of said color channels.

14. The method of claim 13, comprising the further step of determining said amplification factors for individual emissions by solving a linear equation system.

15. The method of claim 13, comprising the further step of determining said amplification factors for individual emissions utilizing a fuzzy logic method.

16. The method of claim 13, comprising the further step of determining said amplification factors for individual emissions utilizing a neuro-fuzzy logic method.

17. The method of claim 13, wherein the individual emissions are displayed as false colors.

18. A fluorescence microscope comprising:
    an optical illuminating system;
    an optical imaging system;
    an image recording system; and,
    a computer system for carrying out a method including the steps of:
    making several recordings of an image of an object sequentially at time intervals with an electronic camera to obtain partial images;
    introducing lateral displacements between said electronic camera and said image between said recordings;
    joining said partial images to form a compiled image of higher spatial resolution;
    obtaining signals of image points of said partial images at different time points; and,
    amplifying said signals with amplification factors which are dependent upon said time intervals between said recordings.

19. A computer system comprising:
    means for making several recordings of an image of an object sequentially at time intervals with an electronic camera to obtain partial images;
    means for introducing lateral displacements between said electronic camera and said image between said recordings;
    means for joining said partial images to form a compiled image of higher spatial resolution;
    means for obtaining signals of image points of said partial images at different time points; and,
    means for amplifying said signals with amplification factors which are dependent upon said time intervals between said recordings.

20. A computer program product which can be loaded into the memory of a digital computer, said computer program product comprising: a program having a software code for executing a method for recording and displaying fluorescence images with high spatial resolution, the method including the steps of:
    making several recordings of an image of an object sequentially at time intervals with an electronic camera to obtain partial images;
    introducing lateral displacements between said electronic camera and said image between said recordings;
    joining said partial images to form a compiled image of higher spatial resolution;
    obtaining signals of image points of said partial images at different time points; and,
    amplifying said signals with amplification factors which are dependent upon said time intervals between said recordings.

21. The computer program of claim 20, wherein said program is executed when run on said digital computer.

22. A method for recording and displaying fluorescence images with high spatial resolution, the method comprising the steps of:
- providing an object with fluorescing emitting portions emitting fluorescence with an intensity decaying with time according to a decay characteristic;
- making several recordings of an image of said object sequentially at time intervals with an electronic camera to obtain partial images, thereby obtaining signals of image points of said partial images at different time points;
- introducing lateral displacements between said electronic camera and said image of said object between said recordings;
- amplifying said signals with amplification factors which are dependent upon said time intervals between said recordings and on said decay characteristic; and,
- combining said amplified signals from said several recordings to form a displayed image without artefacts of bright and dark image strips.

* * * * *

UNITED STATES PATENT AND TRADEMARK OFFICE
CERTIFICATE OF CORRECTION

| | | |
|---|---|---|
| PATENT NO. | : 7,113,205 B2 | Page 1 of 1 |
| APPLICATION NO. | : 10/078688 | |
| DATED | : September 26, 2006 | |
| INVENTOR(S) | : Markus Cappellaro | |

It is certified that error appears in the above-identified patent and that said Letters Patent is hereby corrected as shown below:

Column 6:

Line 41: delete "$P(i,j) = \sum_{mn} \tilde{P}(k,l)_{tv\mu}$" and substitute -- $P(i,j) = \sum_{m,n} \tilde{P}(k,l)_{tv\mu}$ -- therefor.

Column 8:
Line 43: delete "602" and substitute -- ° -- therefor.

Column 10:
Line 24: delete "$S_1(k,1) = A_{R1}R(k,1) + A_{G1}G(k,1) + A_{B1}(k,1)$" and insert -- $S_1(k,1) = A_{R1}R(k,1) + A_{G1}G(k,1) + A_{B1}B(k,1)$ -- therefor.

Signed and Sealed this

Sixteenth Day of January, 2007

JON W. DUDAS
*Director of the United States Patent and Trademark Office*